(12) United States Patent
Monjaux (10) Patent No.: US 9,953,782 B2
(45) Date of Patent: Apr. 24, 2018

(54) ELECTRIC PULSE GENERATOR (71) Applicant: COMMISSARIAT A L'ENERGIE ATOMIQUE ET AUX ENERGIES ALTERNATIVES, Paris (FR)

(72) Inventor: Philippe Monjaux, Gujan-Mestras (FR)

(73) Assignee: COMMISSARIAT A L'ENERGIE ATOMIQUE E AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/324,558

(22) PCT Filed: Jul. 27, 2015

(86) PCT No.: PCT/EP2015/067171
§ 371 (c)(1),
(2) Date: Jan. 6, 2017

(87) PCT Pub. No.: WO2016/016195
PCT Pub. Date: Feb. 4, 2016

(65) Prior Publication Data
US 2017/0200577 A1    Jul. 13, 2017

(30) Foreign Application Priority Data
Jul. 28, 2014  (FR) ..................... 14 57280

(51) Int. Cl.
*H02J 1/00*    (2006.01)
*H01H 39/00*   (2006.01)
(52) U.S. Cl.
CPC ........ *H01H 39/004* (2013.01); *H01H 39/002* (2013.01)

(58) Field of Classification Search
CPC ......................... H01H 39/004; H01H 39/002
See application file for complete search history.

(56) References Cited

U.S. PATENT DOCUMENTS

| | | |
|---|---|---|
| 3,238,321 A | 3/1966 | Lawwill et al. |
| 4,563,556 A | 1/1986 | Goldstein |

(Continued)

FOREIGN PATENT DOCUMENTS

| | | |
|---|---|---|
| DE | 24 12 261 B1 | 8/1975 |
| DE | 44 38 157 C1 | 12/1995 |

(Continued)

OTHER PUBLICATIONS

International Search Report dated Oct. 29, 2015 in PCT/EP15/067171 Filed Jul. 27, 2015.

(Continued)

*Primary Examiner* — Daniel Cavallari
(74) *Attorney, Agent, or Firm* — Oblon, McClelland, Maier & Neustadt, L.L.P.

(57) ABSTRACT

An electric pulse generator configured to power at least one load and including an electric discharge switch including at least one piston and a chamber in which the piston can move, a propellant gas-generating trigger for moving the piston, at least one punch rigidly connected to an end of the piston, and at least one stack of layers formed from at least one pair of electrodes separated by a layer of dielectric material. The electric pulse generator further includes an energy storage device associated with the or each pair of electrodes of the electric discharge switch in at least one series connection, the load or each load being configured to be connected in parallel with the or each series connection.

15 Claims, 4 Drawing Sheets

(56) References Cited

U.S. PATENT DOCUMENTS 5,252,796 A 10/1993 Hedger
2013/0150935 A1 6/2013 Weissberg et al.

FOREIGN PATENT DOCUMENTS

DE 297 00 594 U1 3/1997
EP 0 158 482 A1 10/1985

OTHER PUBLICATIONS

French Search Report dated Apr. 17, 2015 in French Application No. 14 57280 Filed Jul. 28, 2014.

ELECTRIC PULSE GENERATOR

TECHNICAL FIELD

The present invention relates to an electric pulse generator. Such an electric pulse generator can be used in any field requiring high voltage fast electric discharges such as firing devices, high pulsed power generators such as Marx generators, or inductive voltage adder or IVA generators, or protective devices enabling an energy source to be short-circuited.

STATE OF PRIOR ART

High voltage fast switching can be obtained by an electric discharge switching element of the gas filled or vacuum spark gap type. The design of these spark gaps is tricky since they have to hold the load voltage of capacitors static, capacitors of which they must trigger the discharge and they must be hardly inductive in order to be able to carry out very fast discharges. Multichannel spark gaps are recommended. Another drawback thereof is that they are bulky. They include several groups of electrodes. Furthermore, they usually require complex triggering systems to synchronize discharges in the different groups of electrodes.

On some high pulsed power generators, instead of using an electric discharge switching element, there are explosive based pyrotechnic devices which enable, when they are fired, to close an electric contact. The desired effect is the fast projection of matter by an explosive, which results in the destruction of an insulating area and the closing of the electric contact. One drawback is that it is difficult to handle the destruction of the insulating area with a projection of matter.

Power semi-conducting components can also be used as high power switches. Their drawback is that they cannot operate in some radiative environments and have a limited voltage and/or discharge current.

DISCLOSURE OF THE INVENTION

The aim of the present invention is precisely to provide an electric pulse generator which is simple, light and sturdy.

Another aim of the invention is to provide an electric pulse generator the cost of which is very low.

Still another aim of the invention is to provide an electric pulse generator which can be easily integrated into an electric circuit since it is in one piece and compact.

An additional aim of the invention is to provide an electric pulse generator which is particularly reliable, since it is not subject to self-initiating.

Still an additional aim of the invention is to provide an electric pulse generator which does not need any peripheral functions for its switching, such as bulky expansive high voltage triggers.

An additional aim of the invention is to provide an electric pulse generator which is operational in harsh, natural or artificial radiative environments, that is in the presence of neutrons, protons, heavy ions, X-rays, gamma rays, or under vacuum.

In order to reach these aims, the present invention provides an electric pulse generator including an electric discharge switch and an energy storage device associated with the or each pair of electrodes of the electric discharge switch in at least one series connection, the generator being intended to power at least one load, the load or each load being intended to be connected in parallel with the or each series connection. The electric discharge switch includes at least one piston and a chamber in which the or each piston is capable of moving, a propellant gas generating trigger for moving the or each piston, located in proximity to an end of the or each piston, at least one punch rigidly connected to the other end of the or each piston, at least one stack of layers, formed from at least one pair of electrodes separated by a layer of dielectric material, the or each stack being located on the side of one or more punches, the or each punch being intended to cooperate with at least one pair of electrodes, the electrodes of each pair being intending to be brought to different potentials before moving the piston carrying the punch intended to cooperate with said pair of electrodes, so that when said piston is speeded up by the gas generated by the trigger, the punch punches the layer of dielectric material separating the electrodes of said pair, resulting in the breakdown of the dielectric material and the occurrence of an electric discharge between the electrodes of said pair.

In order to obtain several electric discharges spaced in time, the or each stack of layers can include several stacked pairs of electrodes, each separated by a layer of dielectric material, two neighbouring pairs being separated by an electrically insulating spacer. Thus, by punching the layers of dielectric material separating several stacked pairs of electrodes, the punch leads to the generation of several electric discharges separated in time.

The thickness of the spacer between two neighbouring pairs of electrodes conditions the time interval between two successive electric discharges.

At least one piston can be fitted with several punches, a same stack including at least as many pairs of electrodes as the number of punches of said piston, these pairs of electrodes being separated by a layer of dielectric material, the electrodes of different pairs being without a direct electric contact. The punches of said piston, by each punching the layer of dielectric material separating two electrodes of a pair of electrodes trigger substantially simultaneous electric discharges.

For the sake of simplicity, the layer of dielectric material can be common to several pairs of electrodes.

The electric discharge switch of the electric discharge generator subject matter of the invention can include several pistons, each fitted with at least one punch, and a stack of layers dedicated to each of the pistons, each stack of layers including at least one pair of electrodes per punch of the dedicated piston, these electrodes being separated by a layer of dielectric material. Thus, the punches by each perforating a layer of dielectric material can trigger substantially simultaneous or successive electric discharges.

The propellant gas trigger is advantageously a gas generating pyrotechnic cartridge.

The or each punch is advantageously made of an electrically insulating material, preferably selected from polyethylene, polypropylene, polyvinyl chloride, ceramics, a resin or of an electrically conducting material, preferably of steel.

The dielectric material of the layer is preferably selected from polyethylene, polyimides, kapton (trademark of DuPont de Nemours).

The spacer can be made of an electrically insulating material or an electrically conducting material. The spacer made of an electrically conducting material is provided with at least one hole sized so as to be able to be passed through by a punch, and to be without an electric contact with the punch passing through it, when the punch is made of an electrically conducting material.

The electrodes of the pair or each pair can be made of an electrically conducting material, preferably selected from aluminium, copper, the alloys thereof.

The thickness of the layer of dielectric material separating the or each pair of electrodes is selected as a function of the storage capacity of the energy storage device associated with the or each pair of electrodes so that the electric discharge generated by the electric discharge switch is capable of making the energy storage device discharge itself.

The energy storage device is a voltage source, preferably selected from a capacitor, a capacitor bank, a supercapacitor.

BRIEF DESCRIPTION OF THE DRAWINGS

The present invention will be better understood upon reading the description of exemplary implementations given, by way of purely indicating and in no way limiting example, with reference to the accompanying drawings in which.

Identical, similar or equivalent parts of the different figures bear the same reference numerals so as to facilitate switching from one figure to the other.

The different parts represented in the figures are not necessarily drawn to a uniform scale, so as to make the figures more understandable.

DETAILED DISCLOSURE OF PARTICULAR EMBODIMENTS

Figure 1A:
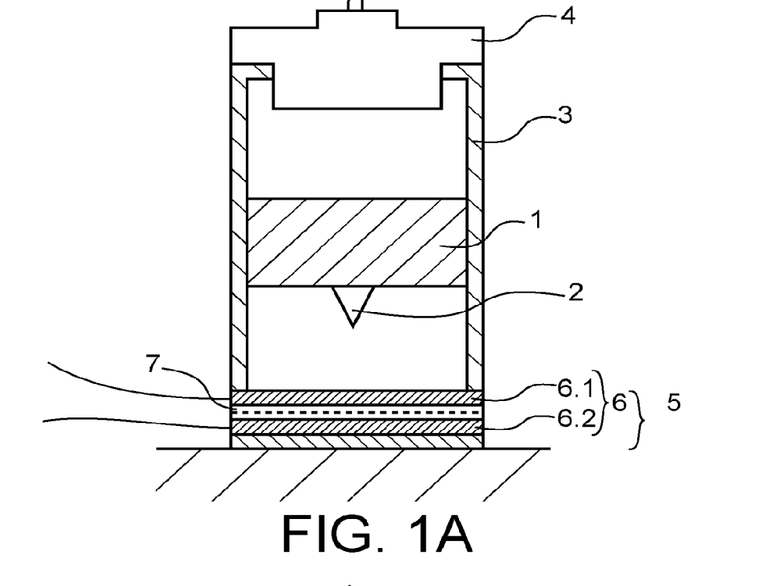
FIGS. 1A, 1B are cross-sections of the electric discharge switch (such as the one present in the electric pulse generator subject matter of the invention) in a rest position and in operation during the movement of its piston.
Figure 1B:
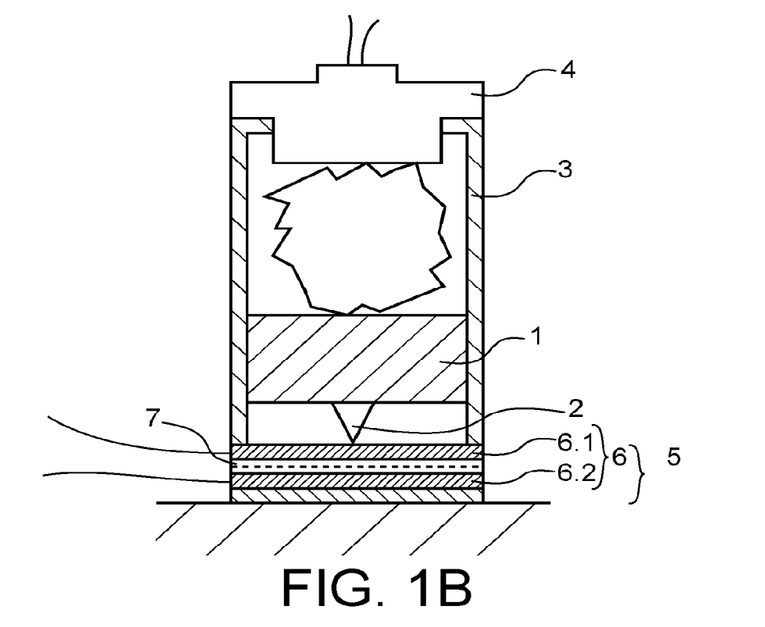
Figure 1C:
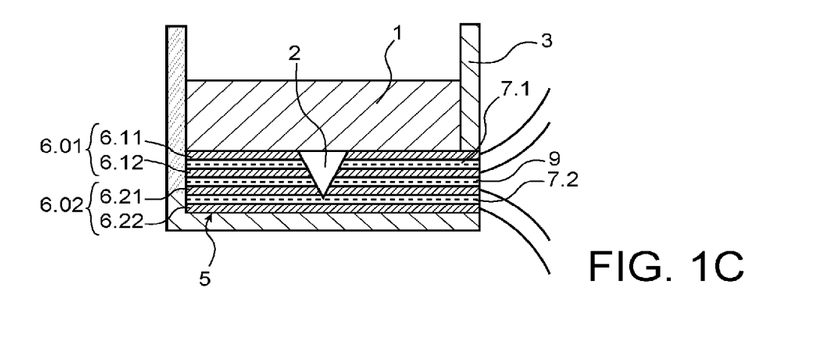
FIG. 1C shows the piston in a final position, the punch having perforated the stack.

Reference is made to FIGS. 1A, 1B which schematically show an electric discharge switch (such as the one present in the electric pulse generator subject matter of the invention), respectively in an open rest position and in the process of being activated aimed at making it pass in the closed position. FIG. 1C will also be considered which shows a detail of the electric discharge switch, in a closed position, once the discharge has occurred.

The electric discharge switch subject matter of the invention includes a piston 1 provided with at least one punch 2. As alternatives described later, the electric discharge switch can include several pistons. Each piston can be provided with several punches.

This piston 1 is capable of moving in a chamber 3 which cooperates with a propellant gas generating trigger 4 for moving the piston 1. The electric discharge switch further comprises at least one stack of layers 5 formed from at least one pair 6 of electrodes 6.1, 6.2 disposed on either side of a layer of dielectric material 7. One of the electrodes 6.1 is referred to as the upper electrode, it is located between the layer of dielectric material 7 and the punch 2. The other electrode 6.2 is referred to as the lower electrode. Electrodes 6.1, 6.2 of the pair of electrodes 6 must be beforehand brought to different potentials, before the switch can be activated to make it pass from the open position to the closed position. Each pair 6 of electrodes is associated with a punch 2.

Electrodes 6.1, 6.2 are made in an electrically conducting material conventionally used in the field of electricity, such as for example copper, aluminium or the alloys thereof. The dielectric material of the layer 7 is an electrically insulating material conventionally used in the field of electricity, such as for example polyethylene, polyimides, kapton (trademark of Du Pont de Nemours). Its thickness is enough to hold without a breakdown the load voltage applied between the electrodes 6.1, 6.2 of the pair 6.

The punch 2 can be made in an electrically insulating material or in an electrically conducting material. It must be sufficiently hard to be able to penetrate the dielectric material of the layer 7. This material can be for example steel if it is electrically conducting or for example polyethylene, polypropylene, polyvinyl chloride, ceramics, a resin if it is electrically insulating.

The piston 1 is placed between the propellant gas generating trigger 4 and the stack of layers 5, the punch 2 being on the side of the stack of layers 5. The piston 1 is disposed facing the stack of layers 5, the direction of movement thereof being substantially perpendicular to the main plane of the layers of the stack 5. In the figures, the chamber 3 leans on one side on the stack of layers 5 and on the opposite side, is closed by the propellant gas generating trigger 4. Other configurations are possible for the arrangement between the chamber 3, the stack of layers 5 and the propellant gas generating trigger 4.

In FIG. 1A, the electric discharge switch is in the open position. The piston 1 is in a rest position, stationary, the propellant gas generating trigger 4 is idle and the punch 2 is at a distance from the stack of layers 5. There is a space between the propellant gas generating trigger 4 and the piston 1 but this is not compulsory.

In FIG. 1B, the electric discharge switch is in the process of being activated, the propellant gas generating trigger 4 has been triggered, it produces gas in the chamber 3 to move the piston 1 and the latter gets closer to the stack of layers 5 as far as hitting it with enough force for the punch 2 to perforate the upper electrode 6.1 of the pair 6. It first strikes this upper electrode 6.1. Once it has perforated it, it penetrates the layer of dielectric material 7. The dielectric material 7 is thus locally embrittled by the punch 2. This local embrittlement results in a breakdown of the dielectric material 7, the appearance of an electric discharge between both electrodes 6.1, 6.2 of the pair 6 and therefore the flowing of a short-circuit current between both electrodes 6.1, 6.2 of the pair 6. The discharge current flows in the plasma generated by the breakdown of the dielectric material 7. The electric discharge switch passes to the closed position. The closing of the electric discharge switch is extremely fast with respect to the movement speed of the piston 1. It is in the order of a few tens of nanoseconds whereas the time taken by the punch 2 to hit the stack 5 is in the order of a few tens of microseconds.

FIG. 1C shows the piston 1 at the end of travel position. In this figure, the stack of layers 5 includes several stacked pairs 6.01, 6.02 of electrodes. Two neighbouring pairs 6.01, 6.02 of electrodes are separated by an electrically insulating spacer 9. The electrodes 6.11, 6.12 and 6.21, 6.22 of each pair 6.01, 6.02 are separated by a layer of dielectric material, respectively 7.1 for the first pair 6.01 and 7.2 for the second pair 6.02. The punch 2 has perforated both electrodes 6.11, 6.12 of the first pair 6.01 and the layer of dielectric material 7.1 separating them, the spacer 9, the first electrode 6.21 of the second pair 6.02 of electrodes and has punched the layer of dielectric material 7.2 separating the electrodes 6.21, 6.22 of the second pair 6.02.

Figure 1D:
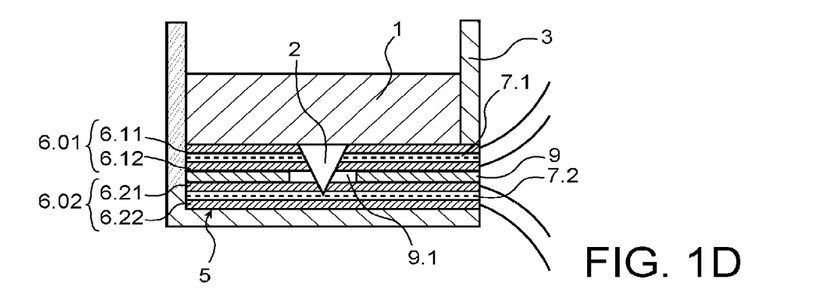
FIG. 1D shows an embodiment in which the stack includes a spacer fitted with a hole and two stacked pairs of electrodes.

The spacer 9 is made of an electrically insulating material conventionally used in the field of electricity or of an electrically conducting material conventionally used in the field of electricity, as far as it has a through hole enabling the electrically conducting punch 2 to pass through the hole without coming in electric contact with it. This latter embodiment is illustrated in FIG. 1D. The hole is referenced 9.1.

Such a stack 5 makes it possible to obtain several electric discharges shifted in time, one occurs when the punch 2 hits the layer of dielectric material 7.1 separating the electrodes 6.11, 6.12 of the first pair of electrodes 6.01 and the other when the punch 2 hits the layer of dielectric material 7.2 separating both electrodes 6.21, 6.22 of the second pair of electrodes 6.02. The thickness of the spacer 9 helps to adjust the time interval between both electric discharges.

The propellant gas generating trigger 4 can be a pyrotechnic generator which uses a pyrotechnic load for generating gas. A conventional pyrotechnic generator can be used such as those used in safety and protection devices such as safety airbag for automobiles. In a known and not depicted manner, the pyrotechnic load is in close contact with an igniter, and this igniter must be connected to a low voltage generator. The igniter is a heating resistor or a fuse type squib. Firing the pyrotechnic gas generator is carried out thanks to a low voltage current applied to the igniter, the latter heats by Joule effect and the heat is transmitted by thermal conduction to the pyrotechnic load which is in contact with the igniter. This firing is simple to be implemented, it can be carried out remotely.

As an alternative, a propellant gas generator of another type could be used such as a hybrid gas generator or a cold gas generator. These gas generators are also conventional.

Figure 3A:
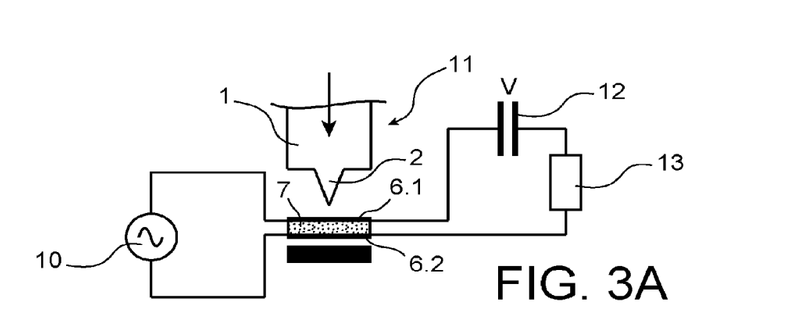
FIGS. 3A to 3E are schematic descriptions of different alternatives of an electric pulse generator subject matter of the invention.
Figure 3B:
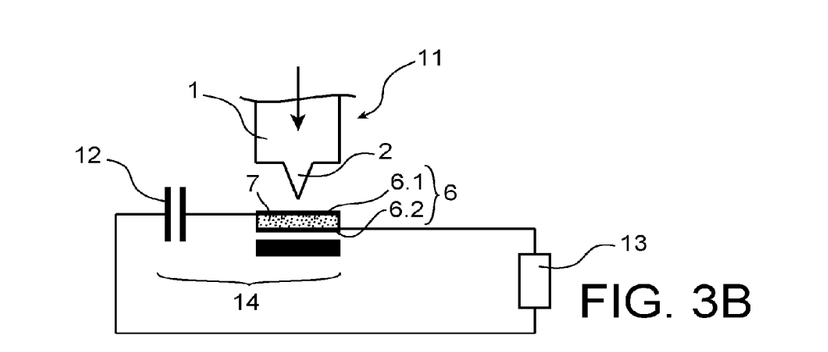
Figure 3C:
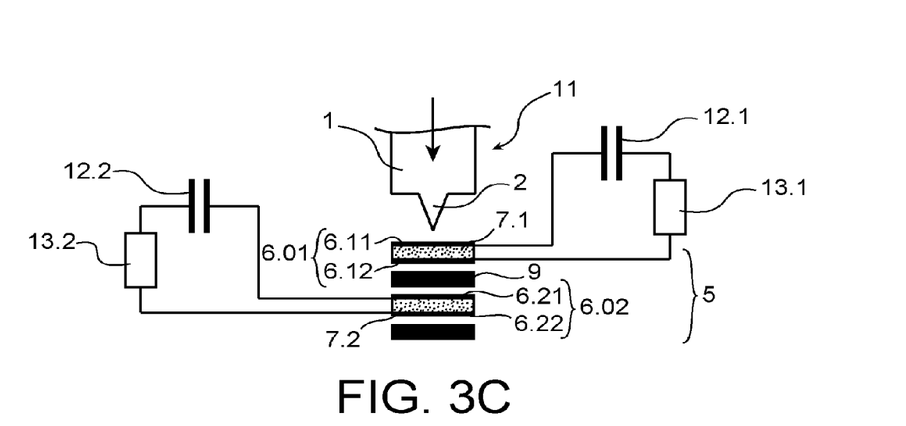
Figure 3D:
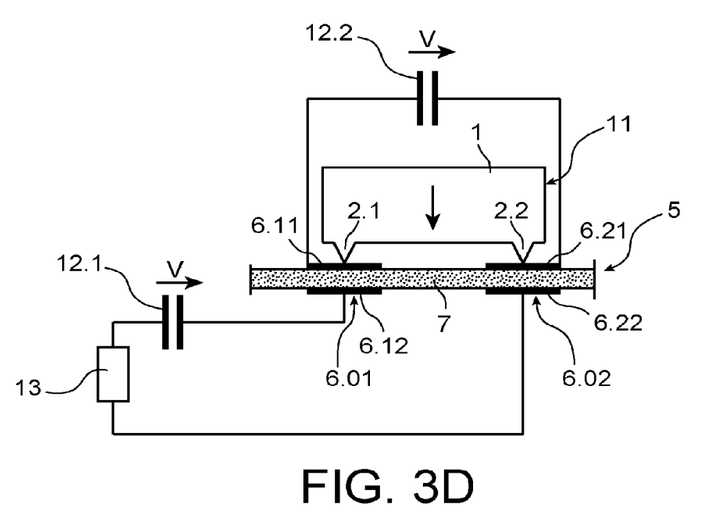

In another embodiment, the piston 1 is provided with several punches 2.1, 2.2 to generate several electric discharges as represented in FIG. 3D. The discharges are substantially simultaneous.

Figure 3E:
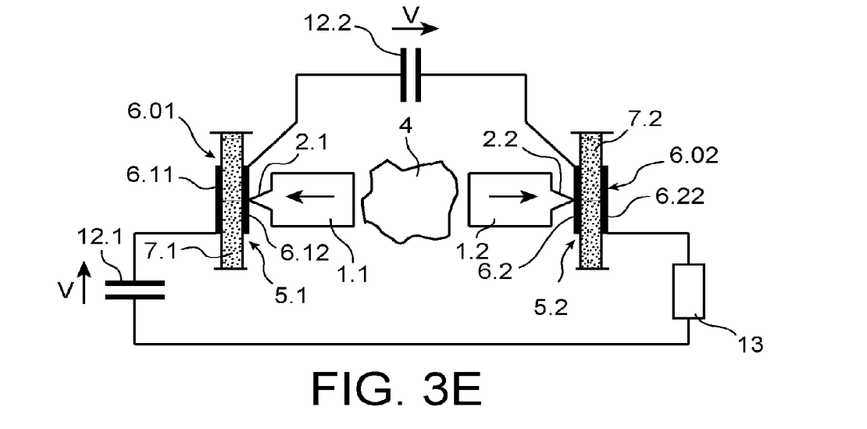

To obtain discharges shifted in time, it is possible to provide several pistons each fitted with a punch as illustrated in FIG. 3E described later. Such a structure could also provide simultaneous discharges.

Figure 2:
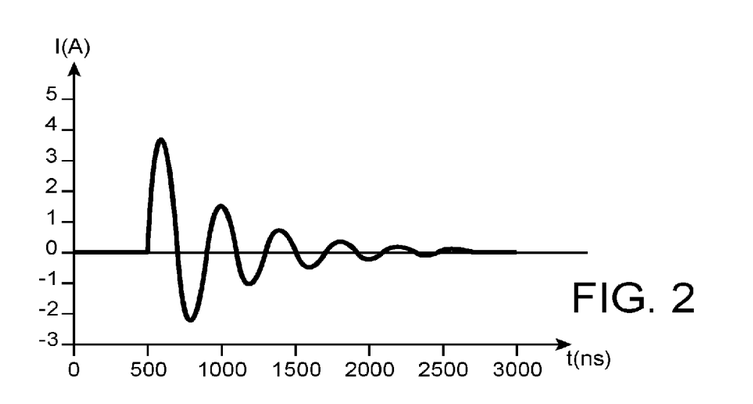
FIG. 2 shows the aspect of the discharge current flowing between both electrodes of a pair of electrodes of the electric discharge switch of the invention as a function of time.

FIG. 2 shows a time chart of the amplitude of the discharge current which appears when the punch 2 slits the layer of dielectric material separating both electrodes of a pair of electrodes. An electric discharge appears as soon as the layer of dielectric material is perforated whereas the propellant gas generating trigger takes several hundreds of microseconds to trigger. The shape of the represented signal is linked to the characteristics R, L, C of the discharge circuit in which the electrodes of the pair are connected.

FIGS. 3A to 3E show several alternatives of an electric pulse generator subject matter of the invention.

The electric pulse generator is fitted with at least one electric discharge switch 11 subject matter of the invention. The electric pulse generator subject matter of the invention includes an electric discharge switch 11 and, additionally, at least one electric energy storage device 12. The electric discharge switch 11 is only symbolized by a portion of at least one piston 1 provided with at least one punch 2 and at least one stack of layers 5 provided with at least one pair of electrodes 6. Each punch is associated with a pair of electrodes.

In FIGS. 3A and 3B, the stack of layers 5 includes only one pair 6 of electrodes 6.1, 6.2 separated by a layer of dielectric material 7.

The electric energy storage device 12 has one terminal thereof linked to a first electrode 6.1 of the pair of electrodes 6, the other terminal thereof is intended to be linked to a first terminal of a load 13. The other electrode 6.2 of the pair of electrodes 6 is intended to be linked to the second terminal of the load 13. The energy storage device 12 and the stack of layers 5, which acts as a super-efficient capacitor, form a series assembly 14, the load 13 is connected in parallel with the series assembly 14.

The load 13 is intended to be powered by an electric pulse provided by the electric pulse generator. Both electrodes 6.1, 6.1 of a pair of electrodes helping to form the stack of layers 5 of the electric discharge switch 11 are intended to be brought, before triggering the latter, to different potentials. The energy storage device 12 must also be loaded before triggering the electric discharge switch 11 to make it pass from its open position to its closed position. The voltage across the electrodes of a pair of electrodes is identical to the one existing across the energy storage device 12 before triggering the electric discharge switch 11. FIG. 3A shows with reference 10 an electric power source to which both electrodes 6.1, 6.2 of the pair 6 are linked. This electric power source 10 will also act to load beforehand the energy storage device 12. This electric power source 10 is not depicted in FIGS. 3B to 3E for the sake of simplicity.

In FIGS. 3A and 3B, the electric discharge switch 11 is provided with only one pair of electrodes 6. The energy storage device 12 is placed on one side of the electric discharge switch 11 and the load on the other side 13. When the punch 2 hits the layer of dielectric material 7 separating both electrodes 6.1, 6.2 of the pair of electrodes 6, the electric discharge switch closes letting a current flow between the energy storage device 12 and the load 13, resulting in the discharge of the energy storage device 12.

The thickness of the layer of dielectric material 7 separating both electrodes 6.1, 6.2 of the pair of electrodes 6 is selected as a function of the load voltage V across the energy storage device 12 or more generally of the storage capacity of the energy storage device 12. Thus, the electric discharge generated by the electric discharge switch 11 is capable of making the energy storage device 12 discharge itself.

The energy storage device 12 can be any voltage source such as for example a capacitor, a capacitor bank, a super-capacitor.

In FIG. 3C, the electric discharge switch 11 includes a piston 1 fitted with only one punch 2 and a stack of layers 5 formed from two pairs of electrodes 6.01, 6.02 separated by a spacer 9 made of a dielectric material. There are an energy storage device 12.1, 12.2 and a load 13.1, 13.2 cooperating with each associated pair of electrodes 6.01, 6.02. The connection between each associated pair of electrodes 6.01, 6.02, each associated energy storage device 12.1, 12.2 and each associated load 13.1, 13.2 is the same as in FIG. 3A. The breakdowns of the dielectric material are spread out in time since both pairs of electrodes 6.01, 6.02 are superimposed and separated by the spacer 9. The discharges of the energy storage devices 12.1, 12.2 in each load 13.1, 13.2 are also spread out in time.

In FIG. 3D, the piston 1 is fitted with two punches 2.1, 2.2 made of an electrically insulated material and the stack of layers 5 includes two pairs 6.01, 6.02 of electrodes. Each punch will cooperate 2.1, 2.2 with one of the pairs of electrodes 6.01, 6.02. In each pair 6.01, 6.02, the electrodes 6.11, 6.12 and 6.21, 6.22 are separated by a layer of dielectric material 7. Both pairs of electrodes 6.01, 6.02 are without a direct electric contact.

Only one layer of dielectric material 7 can be sufficient, it is then used by both pairs of electrodes 6.01, 6.02. As an alternative, two layers of dielectric material 7.1, 7.2 can be provided as in FIG. 3E. Both pairs of electrodes can be side by side as in FIG. 3D. The punches 2.1, 2.2 and the pairs of electrodes 6.01, 6.02 are arranged relative to each other so that the electric discharges at the discharge switch are substantially simultaneous in FIG. 3D.

In FIG. 3E, there are several pistons 1.1, 1.2, they are independent. Each of them is provided with a punch 2.1, 2.2. They could of course be provided with several punches. There are as many distinct stacks 5.1, 5.2 of layers as pistons. Each of them is dedicated to a piston. They are each provided with at least one pair of electrodes 6.01, 6.02. In this simplified example, each punch 2.1, 2.2 is associated with a single pair of electrodes. The stacks of layers or at least one of them could of course have been made as illustrated in FIG. 1C or 1D. The propellant gas generating trigger 4 (schematized as an explosion) is intended to move both pistons 1.1, 1.2. Both pistons will have opposite directions of movement in this non-limiting embodiment. Their movement occurs substantially simultaneously upon triggering the gas generating trigger. To obtain successive electric discharges, that is shifted in time, the perforation of the dielectric layer 7.1, 7.2 of each stack 6.01, 6.02 just has to be made at different times. To do so, the pistons 1.1, 1.2 just have to have travels of different lengths before the perforation occurs. They will thus take different times to each reach the dielectric layer they will perforate.

With this type of configuration, it is possible that the electric discharges occur simultaneously. To do so, the pistons 1.1, 1.2 just have to have travels of the same length before the perforation occurs. They will thus take the same time to each reach the dielectric layer they will perforate.

The electric pulse generator, depicted in FIG. 3D or 3E, also includes two energy storage devices 12.1, 12.2 connected in series with the pairs of electrodes 6.01, 6.02. The load 13 has to be coupled across the series connection. The series connection is an alternating connection with, starting from a terminal of the load 13, one of the energy storage devices 12.1, a pair of electrodes 6.01, the second energy storage device 12.2 and the second pair of electrodes 6.02. The other terminal of the load 13 is connected to the second electrode 6.22 of the second pair of electrodes 6.02. In this context, the second electrode is not hit first by a punch.

By generating two discharges substantially simultaneously, the load 13 is brought to a potential 2V corresponding to the sum of voltages V appearing across each energy storage device 12.1 and 12.2. The voltage across one of the energy storage devices could be different from the voltage across the other energy storage device.

The configuration of FIG. 3E makes it possible to operate with higher voltages V than those of the configuration of FIG. 3D, since the distance between both punches 2.1, 2.2 is greater, which increases the electric insulation during the charge and discharge.

The electric discharge switch is insensitive to harsh environments, it can operate under vacuum, in radiative environments. The electrodes of the stack are totally electrically insulated by the layer of dielectric material and there is no risk of surface breakdown. The electric discharge switch does neither run the risk of a spontaneous switching. It is particularly reliable.

It does not need to cooperate with expensive peripheral elements to make it operate such as for example high voltage triggers.

The electric discharge switch is a simple, compact, one piece device. It can easily be integrated into an electric circuit. Its cost is low thanks to its components, simple mechanic parts such as the piston, the stack with one or several pairs of electrodes and one or several layers of dielectric material, a conventional propellant gas generating trigger.

It can be easily adapted to the energy storage device with which it will cooperate by adjusting the thickness of the layer of dielectric material between two electrodes of a pair, the geometry of the stack or of each stack, the number of pairs of electrodes, of pistons, of punches.

It is insensitive to the discharge current when it is used in an electric pulse generator with at least one energy storage device.

According to the configuration of the electric discharge switch, it can be easily reused after replacing the stack of layers and the propellant gas generating trigger. The latter can be a single impulse or multiple impulse trigger.

Although several embodiments of the present invention have been represented and described in a detailed manner, it is to be understood that different changes and modifications can be brought without departing from the scope of the invention. The different described alternatives can be combined to each other.

The invention claimed is:

1. An electric pulse generator, comprising:
an electric discharge switch, the electric discharge switch including at least one piston and a chamber in which the or each piston is configured to move, a propellant gas-generating trigger for moving the or each piston located in proximity to a first end of the or each piston, at least one punch rigidly connected to a second end of the or each piston, at least one stack of layers formed from at least one pair of electrodes separated by a layer of dielectric material, the or each stack being located on a side of one or more punches, the or each punch being configured to cooperate with at least one pair of electrodes, the electrodes of the pair being configured to be brought to different potentials before moving the piston carrying the punch configured to cooperate with the pair of electrodes, so that when the piston is speeded up by the gas generated by the propellant gas-generating trigger, the piston punches the layer of dielectric material separating the electrodes of the pair, leading to breakdown of the dielectric material and occurrence of an electric discharge between the electrodes of the pair, the electric pulse generator configured to power a load;
the electric pulse generator further comprising an energy storage device associated with the or each pair of electrodes of the electric discharge switch in at least one series connection, the load or each load configured to be connected in parallel with the or each series connection.

2. The electric pulse generator according to claim 1, wherein the or each stack of layers includes plural stacked pairs of electrodes, each separated by a layer of dielectric material, two neighbouring pairs being separated by an electrically insulating spacer, so that the punch configured to cooperate with the pairs of electrodes by punching the layers of dielectric material leads to generation of plural electric discharges separated in time.

3. The electric pulse generator according to claim 2, wherein thickness of the spacer between two neighbouring pairs of electrodes conditions a time interval between two successive electric discharges.

4. The electric pulse generator according to claim 1, wherein at least one piston is fitted with plural punches, a same stack including at least as many pairs of electrodes as a number of punches of the piston, the pairs of electrodes being separated by a layer of dielectric material, the electrodes of different pairs being without a direct electric contact.

5. The electric pulse generator according to claim 4, wherein the layer of dielectric material is common to plural pairs of electrodes.

6. The electric pulse generator according to claim 4, wherein the punches of the piston by each punching the layer of dielectric material separating two electrodes of a pair of electrodes trigger substantially simultaneous electric discharges.

7. The electric pulse generator according to claim 1, wherein the electric discharge switch includes plural pistons, each fitted with at least one punch and a stack of layers dedicated to each piston, each stack of layers including at least one pair of electrodes per punch of the dedicated piston, the electrodes being separated by a layer of dielectric material, wherein the punches, by each perforating a layer of dielectric material, trigger substantially simultaneous or successive electric discharges.

8. The electric pulse generator according to claim 1, wherein the propellant gas generating trigger is a gas generating-pyrotechnic cartridge.

9. The electric pulse generator according to claim 1, wherein the or each punch is made of an electrically insulating material or a material selected from polyethylene, polypropylene, polyvinyl chloride, ceramics, a resin, or of an electrically conducting material, or steel.

10. The electric pulse generator according to claim 1, wherein the dielectric material of the layer is selected from polyethylene, polyimides, kapton.

11. The electric pulse generator according to claim 2, wherein the spacer is made of an electrically insulating material.

12. The electric pulse generator according to claim 2, wherein the spacer is made of an electrically conducting material, the spacer including at least one hole sized to be able to be passed through by a punch, and to be without an electric contact with the punch passing through it, when the punch is made of an electrically conducting material.

13. The electric pulse generator according to claim 1, wherein the electrodes of the pair or of each pair are made of an electrically conducting material or selected from aluminium, copper, or alloys thereof.

14. The electric pulse generator according to claim 1, wherein thickness of the layer of dielectric material separating the or each pair of electrodes is selected as a function of the storage capacity of the energy storage device associated with the or each pair of electrodes so that the electric discharge generated by the electric discharge switch is capable of making the energy storage device discharge itself.

15. The electric pulse generator according to claim 1, wherein the energy storage device is a voltage source, or is selected from a capacitor, a capacitor bank, a supercapacitor.

* * * * *

UNITED STATES PATENT AND TRADEMARK OFFICE
CERTIFICATE OF CORRECTION

PATENT NO. : 9,953,782 B2
APPLICATION NO. : 15/324558
DATED : April 24, 2018
INVENTOR(S) : Philippe Monjaux

Page 1 of 1

It is certified that error appears in the above-identified patent and that said Letters Patent is hereby corrected as shown below:

On the Title Page

Item (73), the Assignee's name is incorrect. Item (73) should read:
-- (73) Assignee: COMMISSARIAT A L'ENERGIE ATOMIQUE ET AUX ENERGIES ALTERNATIVES, Paris (FR) --

Signed and Sealed this
Nineteenth Day of February, 2019

Andrei Iancu
*Director of the United States Patent and Trademark Office*